(12) United States Patent
Tiggelman et al.

(10) Patent No.: US 8,579,195 B2
(45) Date of Patent: Nov. 12, 2013

(54) RECONFIGURABLE RADIO-FREQUENCY FRONT-END

(75) Inventors: Markus Petrus Josephus Tiggelman, Eindhoven (NL); Klaus Reimann, Eindhoven (NL)

(73) Assignee: NXP B.V., Eindhoven (NL)

( * ) Notice: Subject to any disclaimer, the term of this patent is extended or adjusted under 35 U.S.C. 154(b) by 161 days.

(21) Appl. No.: 13/060,686

(22) PCT Filed: Aug. 6, 2009

(86) PCT No.: PCT/IB2009/053441
§ 371 (c)(1),
(2), (4) Date: Feb. 24, 2011

(87) PCT Pub. No.: WO2010/023573
PCT Pub. Date: Mar. 4, 2010

(65) Prior Publication Data
US 2011/0163161 A1 Jul. 7, 2011

(30) Foreign Application Priority Data
Aug. 25, 2008 (EP) .................................. 08162912

(51) Int. Cl.
*G06K 7/00* (2006.01)
(52) U.S. Cl.
USPC ........................................................ 235/439
(58) Field of Classification Search
USPC ......... 235/439, 451, 492; 343/861; 340/572.1
See application file for complete search history.

(56) References Cited

U.S. PATENT DOCUMENTS

| 5,257,009 | A | 10/1993 | Narlow |
| 6,480,110 | B2 | 11/2002 | Lee et al. |
| 7,075,412 | B1 | 7/2006 | Reynolds et al. |
| 7,180,467 | B2 | 2/2007 | Fabrega-Sanchez et al. |
| 7,391,325 | B2 * | 6/2008 | Cobianu et al. ............ 340/572.1 |
| 7,898,481 | B2 * | 3/2011 | Qian et al. ............. 343/700 MS |
| 2003/0102961 | A1 | 6/2003 | Fischer et al. |
| 2004/0266481 | A1 * | 12/2004 | Patel et al. .................... 455/558 |
| 2006/0054710 | A1 * | 3/2006 | Forster et al. ................. 235/492 |
| 2006/0220863 | A1 | 10/2006 | Koyama |
| 2007/0296593 | A1 | 12/2007 | Hall et al. |
| 2008/0251889 | A1 * | 10/2008 | Tsao et al. .................... 257/532 |

FOREIGN PATENT DOCUMENTS

| EP | 1 605 391 A1 | 12/2005 |
| GB | 2 419 777 A | 5/2006 |
| WO | 03/050873 | 6/2003 |

OTHER PUBLICATIONS

Bethe, K. : "Uber das mikrowellenverhalten nichlinearer dielektrika", Report, vol. 25, Philips Research, pp. 1-145, (1970).
Tombak, A. et al. : "Voltage-Controlled RF Filters Employing Thin-Film Barium—Strontium—Titanate Tunable Capacitors," IEEE Trans. on Microwave Theory and Techniques, vol. 51, No. 2, pp. 462-467, (Feb. 2003).

(Continued)

*Primary Examiner* — Seung Lee

(57) ABSTRACT

A reconfigurable radio-frequency front-end 20 with an antenna 24 and a resonant circuit within a matching network 22. In order to provide for high tuning range with low cost and low size, a matching network 22 may comprise at least one electrically tunable passive solid-state dielectrical component 6 on a carrier substrate 2.

15 Claims, 4 Drawing Sheets

(56) References Cited

OTHER PUBLICATIONS

Chen, L.-Y, et al. : "Analogue Tunable Matching Network Using Integrated Thin-Film BST capacitors," IEEE MTT-S International Microwave Symposium Digest, pp. 261-264, (2004).

Chamberlain, M. : "A software defined HF radio," IEEE Military Communications Conference (MILCOM), vol. 4, pp. 1-6, (Oct. 2005).

Bardsley, J., : "Perspectives on Plastic Electronics Markets and Applications," IMID digest, pp. 231-233, (2005).

Neo, W.C.E., et al. : "Improved Hybrid SiGe HBT Cass-AB Power Amplifier Efficiency Using Varactor-Based Tunable Matching Networks," IEEE, Proceedings of the Bipolar/BiCMOS Circuits and Technology Meeting, pp. 108-111, (Oct. 2005).

Buisman, K., et al. : "Distortion-Free Varactor Diode Topologies for RF Adaptivity," Microwave Symposium Digest, 2005 IEEE MTT-S International, pp. 157-160, (Jun. 2005).

Gutnik, v., et al. : "RFID and RF directions," IEEE International Solid State Circuits Conference, ISSCC, Session 17, pp. 1-2, (2006).

Ward, M., et. al. : RFID: Frequency, Standards, Adoption and Innovation, JISC Technology and Standards Watch, pp. 1-36, (May 2006).

Gevorgian, S., et al. : "DC Field and Temperature Dependent Acoustic Resonances in Parallel-Plate Capacitors Based on $SrTiO_3$ and $Ba_{0.25}Sr_{0.75}TiO_3$ Films: Experiment and Modeling," Journal of Applied Physics, vol. 99, 124112, pp. 1-11, (2006).

Meng, Q., et al. "An Impedance Matched Phase Shifter Using $BaSrTiO_3$ Thin Film," IEEE Microwave and wireless components letters, vol. 16, No. 6, pp. 345-347, (Jun. 2006).

Chang, S., et al : "A tunable RF MEMS Inductor on Silicon Incorporating an Amorphous Silicon Bimorph in a Low-Temperature Process," IEEE Electron Device Letters, vol. 27, No. 11, (Nov. 2006).

Jiang, B., et al. : "Energy scavenging for inductively coupled passive RFID Systems," IEEE Tran. Instr. Meas., vol. 56, pp. 984-989, (2007).

International Search Report for Int'l. Patent Appln. No. PCT/IB2009/053441 (Nov. 17, 2009).

Internet Citation: http://www.rfidplaza.com/, Feb. 2011.

Internet Citation: http://en.wikipedia.org/wiki/RFID, pp. 1-32, Feb. 2011.

\* cited by examiner

RECONFIGURABLE RADIO-FREQUENCY FRONT-END

FIELD OF THE INVENTION

The subject matter relates to tunable radio-frequency units, which are able to vary the operating frequency or operate in highly variable environments. The subject matter particularly relates to radio-frequency identification (RFID) front-ends and devices.

BACKGROUND OF THE INVENTION

Wireless communication becomes the most popular communication means in the communication society. Integrated circuits and devices supporting radio frequency communication need to be consistent with various standards in different frequency bands. In order to allow multi usage of components for different frequencies, as well as for different standards, the components need to be able to vary their tuning frequency.

One example for radio frequency communication is radio-frequency identification (RFID) technology. RFID is an upcoming technology in many applications. RFID readers are used to locate and readout RFID tags with a unique identification code. The RFID tags can be used as smart labels in stores on products for identification, localization, stock checking and pricing of products. Tracking products or people, in particular in logistic technology, will use RFID technology. Further, RFID tags may be implanted into the human body for identification as well as for medical reasons. Furthermore, access to restricted areas or vehicles may be controlled by RFID technology.

The advantage of the usage of RFID technology, for example compared to conventional barcodes, are dynamic product information, no line-of-sight being required, no human intervention for scanning being required, multiple tag read-outs are possible at the same time, re-usability, durability, and robustness. Obiquitous use of RFID products is expected when technology will be cheap.

The cost of RFID technology is thus a major concern in this field. Cost increasing factors are considered. Different standards exist for RFID readers, RFID writers, as well as for RFID tags. For example, globally multiple operating frequencies are used in current RFID technology. The currently used operating frequencies may be subdivided in four different groups: 1) a low frequency group, which has a frequency range of 30-300 kHz, 2) a high frequency group, which has a frequency range of 3-30 MHz, 3) an ultra high frequency group, which has a frequency range of 300 MHz-3 GHz, and 4) a radio frequency group, which has a frequency range of 2-30 GHz. These four groups are again split in frequency bands for short-range devices, which bands are controlled in the European Union, the US, and other areas of the world. Further, changes to the frequency ranges may apply in the future due to political or economical reasons. For example, frequency ranges may differ depending on country or use case. A higher frequency may result in an increase of the data transmission speed, and extends the signal path from the RFID reader to one or more RFID tags. For example, low frequency and high frequency bands may cover signal distances of 1.5 m at data rates of 25 kbit/s. The ultra high frequency as well as the radio frequency bands may allow signaling up to 10 m at data rates of up to 100 kbit/s.

In view of the above, it is desirable to have re-configurable RFID readers/writers and/or tags, which allow covering a multitude of frequency bands. One constrain, however, is that the RFID tag as well as the RFID reader needs to be cheap in order to allow the RFID technology to become a mass market product. Moreover, in particular relevant for the RFID tag, the drive circuit for receiving and sending within the frequency bands needs to be small in size.

In order to allow for reconfiguration of the RFID reader/writer or the RFID tag, a transmission-reception front-end may be provided, which is re-configurable in view of the transmission and reception frequency. Most of today's tunable filters however, rely on either mechanical or electronic tuning using varactor diodes or switched capacitors. Mechanically tunable cavity filters are not suitable for RFID tags due to their size. Integrated varactor-diode based tunable filters are faster, however, they provide high losses at radio frequency due to their low quality factor. Switched capacitor filter banks are usually big in size.

SUMMARY OF THE INVENTION

In order to provide for multi-usage radio frequency components, which are cheap and small in size, a re-configurable radio-frequency front-end is devised, comprising an antenna with a matching network. The matching network comprises at least one electrically tunable passive solid-state dielectric component on a carrier substrate. The matching network may also be understood as a resonant circuit.

Passive solid-state dielectric components may, for example, be understood as comprising ferroelectric materials offering a high dielectric constant. Furthermore, passive solid-state dielectric component may be understood as comprising material that has no ferroelectric phase transition. By using the tunable passive solid-state dielectrical component within the matching network, which is placed on or within a substrate, one single re-configurable circuit can support at least a part of the above mentioned different frequency bands. The passive solid-state dielectric component allows for integration on a chip or on a stack in combination with commonly used materials. On a carrier substrate, the electrically tunable passive solid-state dielectrical component provides for cheap component integration and high integration factor, thus decreasing the size of the component.

According to embodiments, the dielectric component comprises dielectric material with a relative permittivity of at least 50, preferably 80, at a minimum voltage of 3 Volt. The material may have an equilibrium spontaneous polarization that can be re-oriented by an applied electrical field, for example having a hysteresis loop. This electrical field may be understood as the control voltage applied onto the solid-state dielectric component for tuning. In the paraelectric phase, the spontaneous polarization may equal zero, however, the relative permittivity $\in_r$ remains high and can be changed with the applied electrical field. This enables the fabrication of electrically tunable matching networks, for example having capacitors with high tunability levels. Tunability may be understood as $(Cmax-Cmin)/Cmax$, for example greater than 50%, at DC-voltage levels as low as 2 to 5 V.

As has been mentioned above, the polarization of the solid-state dielectric component may be altered by applying an electrical field. Therefore, in order to control the matching network, i.e. its resonant frequency, embodiments provide controlling the relative permittivity using a control voltage. The control voltage may be applied as an electrical field onto the solid-state dielectric component, thus changing its permittivity and as a consequence changing also the resonance frequency f of the matching network within which the tunable passive solid-state dielectric component is arranged.

According to embodiments, a voltage controller may be provided for controlling the relative permittivity by providing a specific control voltage. For example, the voltage controller may apply the control voltage onto electrodes, which may have a planar structure, upon which the component is applied. The voltage controller may thus provide for adjusting the tuned frequency of the matching network. The tuned frequency may be the resonance frequency of the matching network.

According to embodiments, a control voltage for altering the permittivity may be provided as a continuous change or switched change. For example, changing the control voltage smoothly, allows for a smooth change. If the controlled element exhibits a hysteresis, then the controller might switch the element between two states. Another option is to apply a bias voltage to lower the hysteresis. A third option is that the controller artificially inserts a hysteresis to avoid instable control loops. A switched change of the control voltage may allow for fast changes of the tuning frequency of the matching network.

According to embodiments, the dielectric component may be integrated on the carrier substrate together with at least one of a resistor, a coil, or a control logic. Integrating the components on a carrier substrate may provide for a high degree of integration. Further, the cost of the overall device may be reduced. Also, the size of the devices may be reduced. The matching network may, according to embodiments, be integrated as a single chip or a single package.

Tunable dielectrics may be non-ferroelectric, e.g. with a pyrochlore phase, anti-ferroelectric or ferroelectric thin films, e.g. strontium titanate $SrTiO_3$ and barium strontium titanate $Ba_xSr_{1-x}TiO_3$ (BST). The ferroelectrics might be operated at temperatures below or above the ferroelectric phase transition. Strontium titanate presents high permittivity at significantly low temperatures. However, at higher temperatures, for example room temperature, barium strontium titanate may provide better results. Integrating components based on barium strontium titanate allows for integration with other passive (tunable) devices, or active devices such as monolithic microwave integrated circuits (MMICS), low cost simultaneous fabrication of multiple tunable components, and allows for low losses in high quality films and high power-handling capability. Barium strontium titanate ($Ba_x$, $Sr_{1-x}TiO_3$) may be provided with a composition x between 0.2 and 0.8.

The dielectric material may, according to embodiments, be arranged within a metal-insulator-metal (MIM) capacitor. The MIM integration may allow maximizing the tunability of the capacitance. The MIM structure may comprise a high-k insulator as dielectric. A high-k insulator has a relative permittivity much higher than that of $SiO_2$. Ferroelectric thin film capacitors typically have relative permittivities between 200 and 2000 at zero bias. The capacitors can also be arranged as planar finger structures, giving a lower tuning with identical bias.

The dielectrical component may be a tunable capacitor with a capacitance density of at least 1 $nF/mm^2$. This high capacitance density may allow for larger tuning ranges at lower voltage ranges of the control voltage. It has been found the capacitance density of 1 $nF/mm^2$ allows for tuning within at least one, preferably two of the above named frequency bands.

The tuning ranges may, according to embodiments be at a capacitance tuning ratio (Cmax/Cmin) of 2:1 at a maximum voltage of 3 Volt. This implies, if the inductance is constant, a shift in resonance frequency ($f=1/sqrt(2\pi L_{tot}C_{tot})$) of a factor of $1/sqrt(2)$. The impedance tuning range of matching networks can be higher than the tuning ratio of the capacitor, e.g., by cascading matching network stages or by using a higher loaded quality factor.

According to embodiments, the frond-end may be arranged within one of A) RFID tag, B) RFID reader, and/or C) RFID writer. The RFID tag has the most constrains regarding cost and size. A tag needs to be very small and very cheap to be sold in mass market. RFID readers and RFID writers are not constrained with regard to size, however, also with regard to cost. It secures also investments if they can read many standards and can be reconfigured to read a specific frequency. Readers and writers may be stand-alone devices being arranged in observing areas to observe, whether a tag enters the area or not.

For providing the desired tuning frequency, i.e. the desired resonant frequency the matching network may comprise, according to embodiments, at least one tunable resonant LC circuit in series, parallel and/or in combination of both. The circuit can be tuned to the selected frequency band by tuning the dielectric component using the control voltage.

According to embodiments, at least two frequency bands are selectable by switching between different tunable passive components. For example, it may be possible to provide a switch within the matching network for switching between different tunable passive solid-state dielectric components. Also, it may be possible to provide for more than one matching network on a chip. The desired matching network may be selected by a switch.

According to embodiments, the antenna may form an integral part of the matching network. The antenna may provide DC ground to the matching network. The antenna might be too large to economically integrate it on the same carrier substrate as the dielectric components, especially if frequencies below 500 MHz should be accessible to the front-end. A part of the antenna, e.g., a tapping feed or part of the matching network can nevertheless be integrated.

Another aspect is a radio frequency device comprising a front-end of claim 1. Such a device may, according to embodiments, be arranged as RFID device for reading smart cards or tags for pricing, payment, identification, tracking, and/or locating people and/or products. The RFID device may further be used for implantation into a human body, with or without integrated sensors. Further, the device may be used for security clearance for restricted areas or information. Another case of use may be using an RFID device as described above for starting up a vehicle.

The subject matter is further elucidated by the following Figures and examples, which are not intended to limit the scope of the invention. The person skilled in the art will understand that various embodiments may be combined.

DETAILED DESCRIPTION OF THE DRAWINGS

Figure 1:
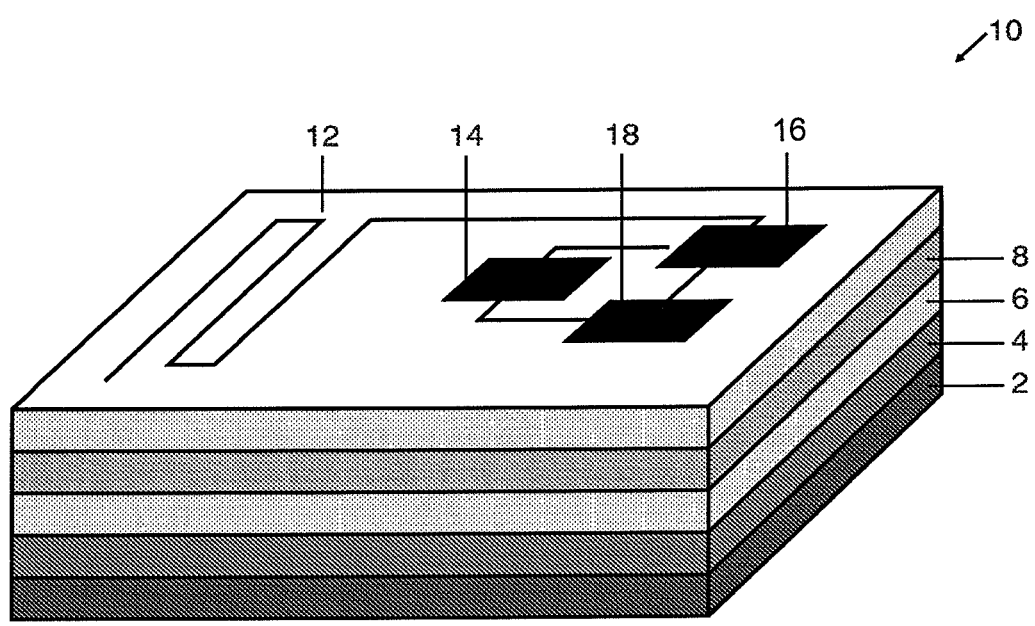
FIG. 1 a dielectric component on a carrier substrate with a matching network.

FIG. 1 illustrates a passive tunable dielectric component on a carrier substrate.

In FIG. 1, a carrier substrate 2 can be provided. The carrier substrate 2 may be a silicon substrate, upon which structures can be etched and grown. Indicated as 4 is a metal sheet, being provided on the substrate 2 at least partially. The sheet 4 may provide a bottom electrode. The dielectric material 6 may be provided above sheet 4, in particular above the area, where sheet 4 covers substrate 2. Above the area, where the dielectric material 6 is arranged, a second metal sheet 8 may be provided. This second sheet 8 may form a top electrode. Further, the metal sheet 8 may provide for connections to further components on the stack 10. Indicated schematically are provided further components on stack 10, for example an antenna 12, a resistor 14, a controller 16, and a connection pad 18.

The component illustrated in FIG. 1 may be used within any kind of radio-frequency communication device. For example, any kind of wireless communication device may use the component illustrated in FIG. 1. It may be possible to integrate the component illustrated in FIG. 1 into a package with other components. For example, the component of FIG. 1 may provide the dielectric material for at least one of a buffer capacitor, a decoupling capacitor, a varactor or a varactor diode. Any such passive component may utilize a dielectric material embedded within the module of FIG. 1.

It may further be possible that the dielectric material is a high-k insulator. A high-k insulator may have a relative permittivity much higher than that of $SiO_2$. Ferroelectric thin film capacitors typically have relative permittivities between 200 and 2000 at zero bias.

Figure 2:
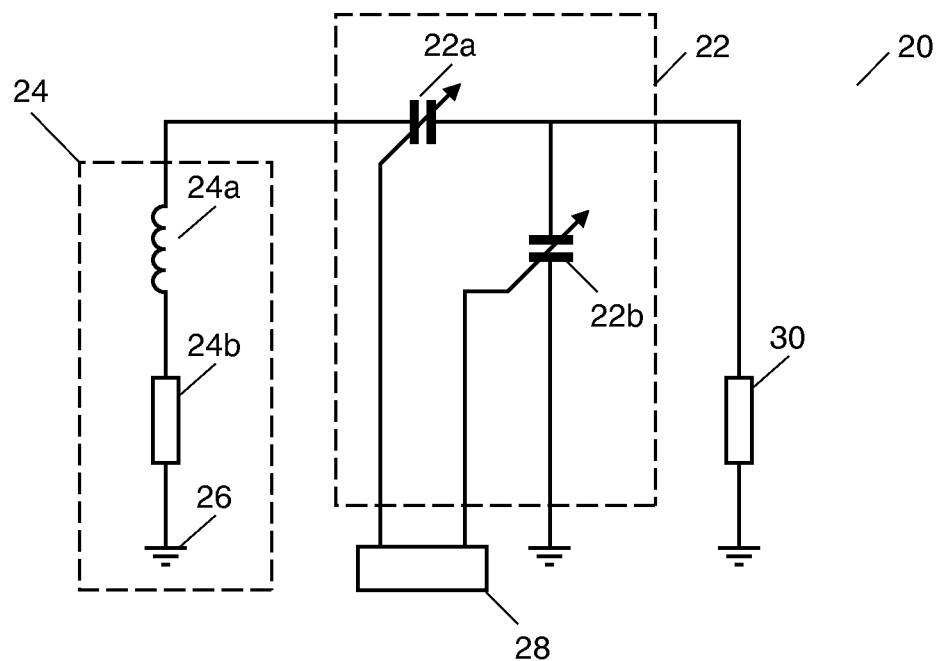
FIG. 2 a first matching network.

FIG. 2 illustrates a first front-end 20 with an antenna 24 and a matching network 22. The antenna 24 may be comprised of an inductor 24a, and a resistor 24b. Antenna 24 may be connected to ground 26. Antenna 24a may be electrically connected to matching network 22. Within matching network 22, according to FIG. 2, there may be arranged two tunable capacitors 22a, 22b being formed as MIM capacitors 22a, 22b. By providing a tuning voltage via a controller 28, the capacitance values of the tunable capacitors 22a, 22b may be changed. The controller 28 may provide for a switching voltage as well as a continuous changing voltage for changing the capacitance values of the capacitors 22a, 22b.

Figure 3:
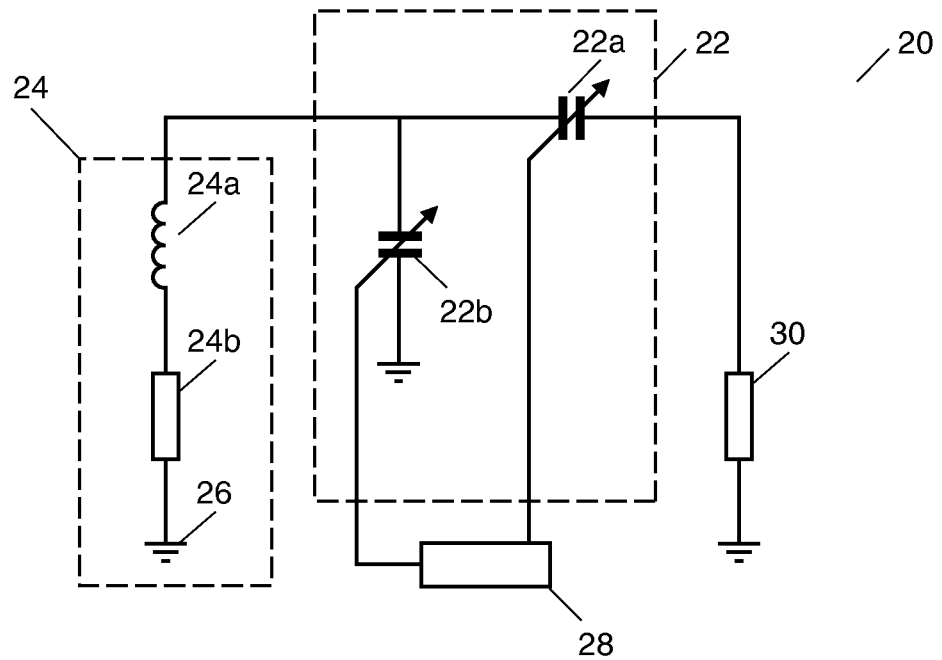
FIG. 3 a second matching network.

FIG. 3 illustrates a similar circuit as FIG. 2, being different in the arrangement of the matching network 22, in particular of the capacitors 22a, 22b. Both matching networks 22 in FIG. 2 and FIG. 3 eliminate the need for a coil in the matching network 22, as the antenna 24 is an inductive antenna. As can be seen in FIG. 2, 3 a transmission-reception network 30 may be connected to the matching network 22, for providing the communication to and from the antenna 24.

Figure 4:
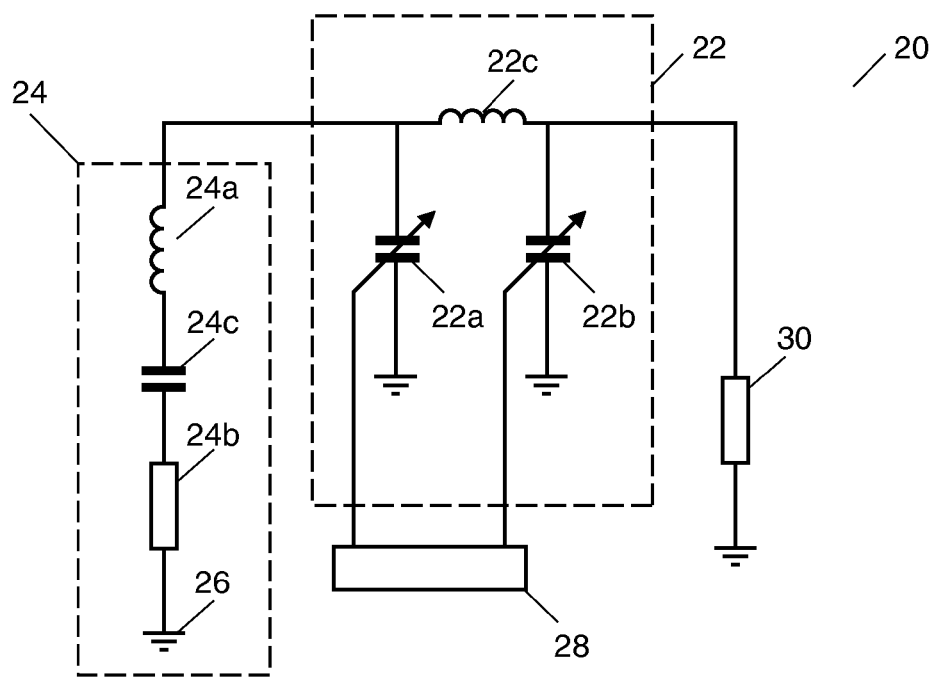
FIG. 4 a third matching network.

The matching network in FIG. 4 comprises in addition to the capacitors 22a, 22b the inductance 22c. Providing the inductance 22c may allow for providing an antenna 24 having a wider range of impedances or for instance, having a capacitive component 24c.

It may be possible, to combine a connection of antenna 24 to either matching network 22 of FIG. 1 or matching network 22 of FIG. 2 or FIG. 3. The capacitors 22a, 22b within the matching network 22 may be different, thus providing different capacitance values of the matching network 22. Switching between the matching networks 22 may provide for different tuning ranges. For example, a first matching network 22 may be arranged for being tunable within low frequency and high frequency, and the second matching network 22 may be arranged for being tunable within ultra high frequency and radio frequency. A switch may switch the antenna 24 between different matching networks 22 depending on the needs of the component.

By providing the tunable component, radio frequency modules may be used with different frequency ranges reducing circuit area and overcoming cost constrains. This may be useful, for example, for radio frequency identification (RFID) front-ends.

Figure 5:
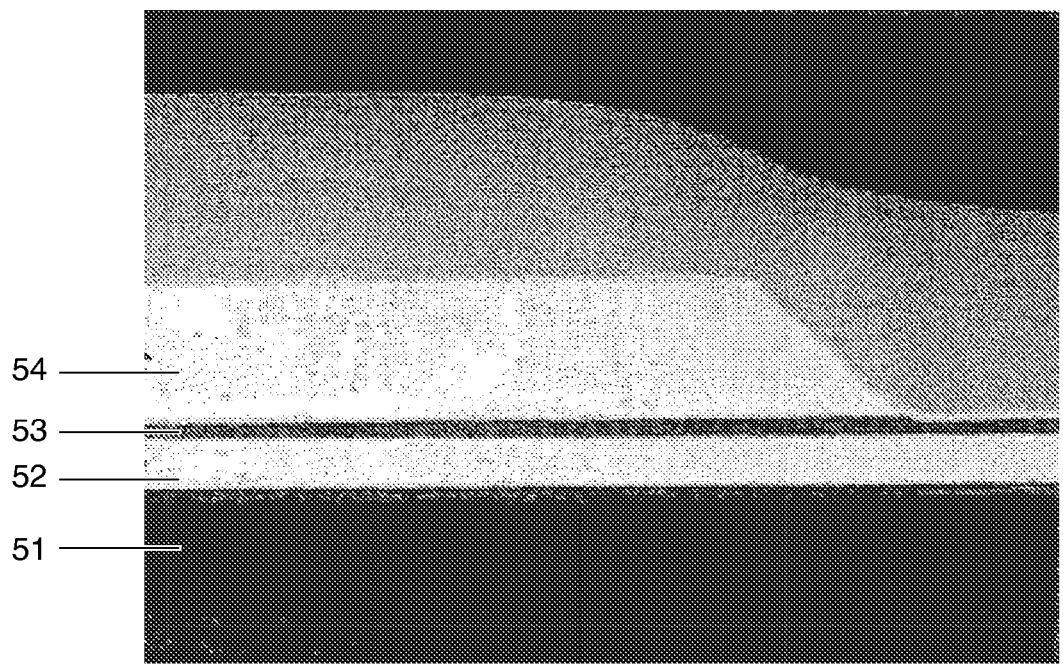
FIG. 5 an electron-microscopical cross-section through a ferroelectric capacitor.

FIG. 5 shows a sectional view onto a tuneable solid-state capacitor having a BST dielectric 53 between a bottom electrode 52 and a top electrode 54 on a carrier substrate 51.

Figure 6:
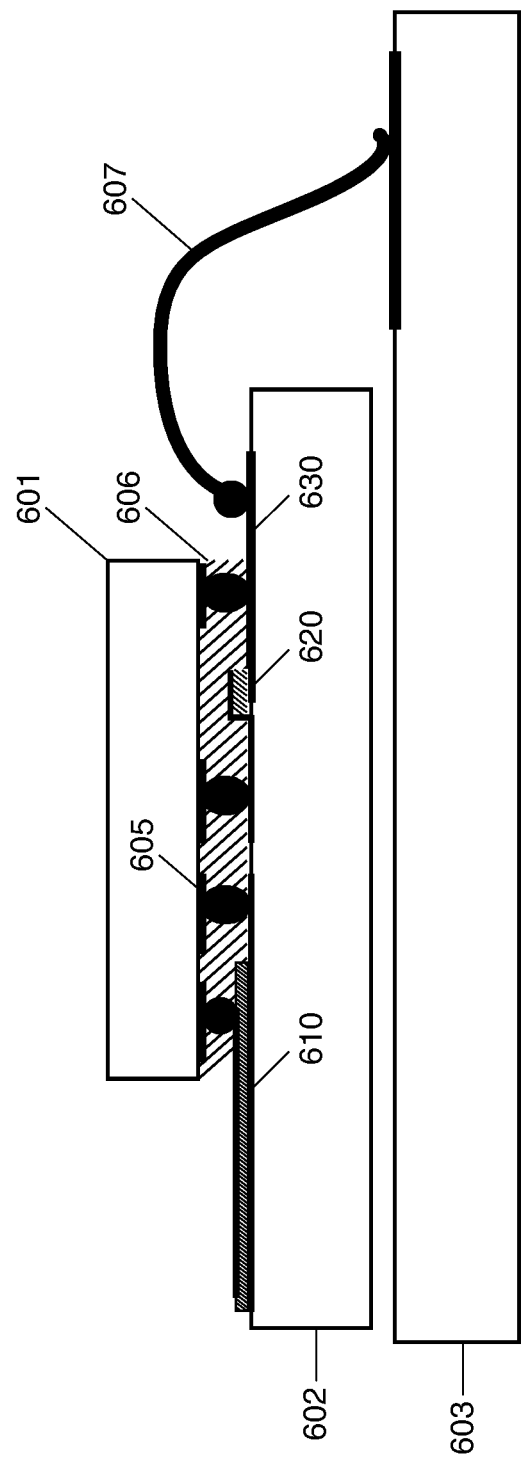
FIG. 6 a system-in-package module with an electrically tunable passive solid-state dielectric component.

FIG. 6 illustrates an RFID chip 601. The RFID chip 601 may be bonded to the substrate 602 by bumps 605 that connect to the interconnects 606 or 630 on the RFID chip 601 or substrate 602. The substrate 602 may be arranged on top of an RFID tag foil 603 or a RFID reader/writer board. Moreover, the RFID tag foil 603 may also be part of a package.

Within the illustrated package, at least one dielectric component 620 may be arranged on the substrate 602 and below the RFID chip 601 or partially as capacitor 620 below the chip 601. The dielectric components 610 or 620 could be tuneable capacitors. The larger capacitors 620 can also act as decoupling or buffer capacitor. A decoupling capacitor would also be advantageously placed close to the connections 607 or 630 to filter unwanted interference and noise.

The invention claimed is:

1. A reconfigurable radio-frequency front-end circuit comprising:
an antenna, and
a resonant circuit within a matching network, the matching network including at least one electrically tunable passive solid-state dielectric component, having a relative permittivity controlled by a control voltage or node integrated on a carrier substrate with said at least one electrically tunable passive solid-state dielectric component, wherein the front-end circuit is comprised within a radio-frequency identification (RFID) device, and the solid-state dielectric component is configured and arranged for tuning, relative to the resonant circuit, to an RF antenna-received signal.

2. The reconfigurable radio-frequency front-end circuit of claim 1, wherein the dielectric component is at least one of
a buffer capacitor;
a decoupling capacitor;
a varactor;
a varactor diode;
a capacitor with a hysteretic C(V) curve.

3. The reconfigurable radio-frequency front end circuit of claim 1, wherein the dielectric component includes a dielectric material with a relative permittivity of at least 50 at a minimum voltage of 3 volts.

4. The reconfigurable radio-frequency front-end circuit of claim 1, wherein the dielectric component is integrated on the carrier substrate together with at least one of
a resistor;
a coil;
a control logic;
an antenna.

5. The reconfigurable radio-frequency front-end circuit of claim 1, wherein at least the matching network is integrated as a single chip or a single package.

6. The reconfigurable radio-frequency front-end circuit of claim 1, wherein the dielectric component includes at least one of
A) $SrTiO_3$
B) $Ba_xSr_{1-x}TiO_3$, with x=0 . . . 1
C) $(Bi_{3x}Zn_{2-3x})(Zn_xNb_{2-x})O_7$, with x=0.4 . . . 0.8
D) $Pb(Zr,Ti)O_3$
E) A mixture of lead magnesium niobate with lead titanate F) materials A-E with at least one of the dopants Mg, Nb, La, Y, Zr, W, Ce, Ta, Fe, or Cr.

7. The reconfigurable radio-frequency front-end circuit of claim 1, wherein the dielectric component is arranged within a metal-insulator-metal (MIM) capacitor.

8. The reconfigurable radio-frequency front-end circuit of claim 1, wherein the dielectric component is a tunable capacitor with a capacitance density of at least 1 nF/mm$^2$.

9. The reconfigurable radio-frequency front-end circuit of claim 1, wherein the front-end is arranged within one of
an RFID-tag;
an RFID reader;
an RFID writer.

10. The reconfigurable radio-frequency front end circuit of claim 1, wherein the dielectric component comprises a dielectric material with a relative permittivity of at least 80, at a minimum voltage of 3 volts.

11. A reconfigurable radio-frequency front-end circuit comprising:
an antenna, and
a resonant circuit within a matching network, the matching network including at least one electrically tunable passive solid-state dielectric component on a carrier substrate, wherein the front-end circuit is comprised within a radio-frequency identification (RFID) device, and the solid-state dielectric component is configured and arranged for tuning, relative to the resonant circuit, to an RF antenna-received signal, wherein the dielectric component includes a dielectric material with a relative permittivity of at least 50 at a minimum voltage of 3 volts, and the relative permittivity is controllable by a control voltage provided at a voltage circuit or node integrated on the carrier substrate.

12. The reconfigurable radio-frequency front-end circuit of claim 11, further comprising a voltage controller or generator for controlling the relative permittivity by providing the control voltage.

13. The reconfigurable radio-frequency front-end circuit of claim 12, wherein the voltage controller is arranged for providing a continuous or switched change of the control voltage for altering the permittivity.

14. A radio frequency device comprising:
a front-end circuit having
an antenna, and
a resonant circuit within a matching network, the matching network including at least one electrically tunable passive solid-state dielectric component, having a relative permittivity controlled by a control voltage or node integrated on a carrier substrate with said at least one electrically tunable passive solid-state dielectric component.

15. The radio frequency device of claim 14 being configured and arranged as RFID device for reading smart cards or tags for pricing, payment, identification, tracking or locating people and/or products, for implantation into a human body, for security clearance for restricted areas or information, or for starting up a vehicle.

* * * * *